(12) United States Patent
Sakaba et al.

(10) Patent No.: US 7,049,174 B2
(45) Date of Patent: May 23, 2006

(54) METHOD OF MANUFACTURING MOUNTING SUBSTRATE AND SURFACE MOUNT CRYSTAL OSCILLATOR

(75) Inventors: Yasuo Sakaba, Saitama (JP); Masakazu Nishiwaki, Saitama (JP)

(73) Assignee: Nihon Dempa Kogyo Co., Ltd., Tokyo (JP)

( * ) Notice: Subject to any disclaimer, the term of this patent is extended or adjusted under 35 U.S.C. 154(b) by 165 days.

(21) Appl. No.: 10/661,978

(22) Filed: Sep. 11, 2003

(65) Prior Publication Data
US 2004/0056729 A1 Mar. 25, 2004

(30) Foreign Application Priority Data
Sep. 13, 2002 (JP) .......................... 2002-268143

(51) Int. Cl.
*H01L 21/44* (2006.01)
*H01L 21/48* (2006.01)
*H01L 21/50* (2006.01)

(52) U.S. Cl. ....................... 438/111; 438/127
(58) Field of Classification Search ................. 438/108, 438/111, 112, 124, 125, 126, 127
See application file for complete search history.

(56) References Cited

U.S. PATENT DOCUMENTS

| 5,614,443 A | * | 3/1997 | Nakashima et al. ........ 156/253 |
| 5,949,294 A | | 9/1999 | Kondo et al. |
| 2004/0036547 A1 | * | 2/2004 | Harima ..................... 331/158 |

FOREIGN PATENT DOCUMENTS

JP 10-98151 4/1998

* cited by examiner

*Primary Examiner*—Phuc T. Dang
(74) *Attorney, Agent, or Firm*—Katten Muchin Rosenman LLP

(57) ABSTRACT

A method of manufacturing a mounting substrate accommodating therein an electronic component for use in a surface mount crystal oscillator and adapted to be joined to a bottom surface of a crystal unit has the steps of defining a recess with a bottom wall and a frame wall having an opening, placing the electronic component in the recess, filling the recess with a resin for protecting the electronic component, and, after the resin is cured, removing at least a portion of the frame wall. The electronic component typically comprises an IC (Integrated Circuit) chip incorporating an integrated oscillating circuit that employs a crystal unit.

13 Claims, 5 Drawing Sheets

METHOD OF MANUFACTURING MOUNTING SUBSTRATE AND SURFACE MOUNT CRYSTAL OSCILLATOR

BACKGROUND OF THE INVENTION

1. Field of the Invention

The present invention relates to a surface mount quartz crystal oscillator having a quartz crystal unit with a mounting substrate joined to the reverse surface thereof, and more particularly to a method of manufacturing a mounting substrate and a surface mount crystal oscillator which employs such a mounting substrate.

2. Description of the Related Art

Surface mount crystal oscillators which have a crystal unit and an IC (Integrated Circuit) chip having an oscillating circuit that employs the crystal unit and are shaped for use in surface-mounted applications are small in size and weight, and hence are widely used as a time or frequency reference source in communications devices such as cellular phones or the like. Particularly, a surface mount crystal oscillator constructed as a temperature-compensated crystal oscillator (TCXO) is suitable for use as a time or frequency reference source in portable devices because it generates a stable oscillating frequency in mobile environments that undergo large temperature changes. One known surface mount crystal oscillator is of the joined type wherein an IC chip is mounted on a mounting substrate and joined to the reverse surface of a crystal unit, as disclosed in Japanese laid-open patent application No. 10-98151 (JP-A-10-098151) for example.

FIG. 1A is a cross-sectional view of such a conventional surface mount crystal oscillator, and FIG. 1B is a plan view of a mounting substrate used in the surface mount crystal oscillator shown in FIG. 1A.

As shown in FIGS. 1A and 1B, the conventional surface mount crystal oscillator comprises crystal unit 1 and mounting substrate 2. Crystal unit 1 has substantially rectangular casing 3 of laminated ceramics having a recess defined therein, quartz crystal blank 4 disposed in the recess, and cover 6 placed on casing 3 and hermetically sealing crystal blank 4 in the recess. Crystal blank 4 comprises a substantially rectangular AT-cut quartz crystal blank, for example. Excitation electrodes (not shown) are formed respectively on the principal surfaces of crystal blank 4, and extension electrodes (not shown) extend from the respective excitation electrodes to opposite sides of one end of crystal blank 4. The sides of the end of crystal blank 4 to which the extension electrodes extend are fixed to a pair of connecting electrodes (not shown) formed on the bottom surface of the recess in casing 3 by electrically conductive adhesive 7. Crystal blank 4 is thus held horizontally in casing 3 and electrically and mechanically connected thereto.

Connecting terminals 5 are formed on the four corners of an outer bottom surface, i.e., a reverse surface, of casing 3 and are electrically connected to crystal blank 4. Connecting terminals 5 are electrically connected to the connecting electrodes on the bottom surface of the recess in casing 3 by electrically conductive paths in casing 3.

Mounting substrate 2 has a substantially rectangular planar shape which is essentially identical to or slightly larger than crystal unit 1, with a recess defined in one principal surface thereof. Specifically, mounting substrate 2 comprises bottom wall 8 in the form of a substantially rectangular plate and frame wall 9 in the form of a substantially rectangular frame. Frame wall 9 serves as a side wall of the recess. Mounting substrate 2 is made of ceramics with frame wall 9 having an opening and laminated on bottom wall 8. Connecting terminals 10 are formed on the upper surface of frame wall 9 which surrounds the recess in alignment with respective connecting terminals 5 on casing 3. Connecting terminals 5 on crystal unit 1 and connecting terminals 10 on mounting substrate 2 are electrically and mechanically connected to each other by solder thereby to join the open side of mounting substrate 2 to the bottom surface of crystal unit 1, completing the surface mount crystal oscillator.

IC chip 12 has a plurality of terminals on one principal surface thereof. IC chip 12 is fixed to bottom wall 8 of mounting substrate 2 by ultrasonic thermo-compression bonding with bumps 11, for example, interposed therebetween. The terminals of IC chip 12 are electrically connected to a circuit pattern on bottom wall 8 of mounting substrate 2 by bumps 11. Resin 13 is poured into the recess in mounting substrate 2 to protect IC chip 12, in particular, the surface of IC chip 12 that is joined to bumps 11.

In the crystal oscillator, IC chip 12 comprises a high-functionality IC chip and incorporates therein, in addition to the oscillating circuit, a temperature compensating mechanism for compensating for temperature-dependent changes of an oscillating frequency and a PLL (Phase-Locked Loop) control circuit for producing a signal having a desired frequency from the original oscillating frequency signal.

Mounting terminals 14 including a power supply terminal, a ground terminal, and an output terminal are disposed on the four corners of an outer bottom surface of bottom wall 8. Mounting terminals 14 are used to mount the surface mount crystal oscillator on a wiring board.

As more and more efforts are made to reduce the size of the outer planar shape of the surface mount crystal oscillator, it becomes more and more difficult to place the IC chip 12 in the recess in mounting substrate 2. Particularly, if a high-functionality IC chip incorporating a PLL control circuit is employed, then since its outer profile is greater than the output profile of ordinary IC chips for use in TCXOs, it is difficult to place such a high-functionality IC chip in the recess in mounting substrate 2.

In Japanese patent application No. 2002-228801 (JP, P2002-228801), the assignee of the present invention has proposed mounting substrate 2 having frame wall 9 with one side thereof removed to make the recess open laterally in the open side of frame wall 9, thus virtually increasing the area of the bottom of the recess for accommodating an IC chip therein, as shown in FIG. 2. With the proposed structure, however, when a resin is poured into the recess for the purpose of protecting the IC chip, the poured resin tends to flow out through the open side of frame wall 9. As a result, mounting substrate 2 is likely to suffer a defect such as a poor appearance, and the productivity for such mounting substrates 2 is low.

SUMMARY OF THE INVENTION

It is therefore an object of the present invention to provide a method of manufacturing a mounting substrate for accommodating an IC chip therein for use in a surface mount crystal oscillator, the mounting substrate being designed for reducing the overall size of the surface mount crystal oscillator and for increased productivity.

Another object of the present invention is to provide a surface mount crystal oscillator which is reduced in overall size and desired for increased productivity.

The first object can be achieved by a method of manufacturing a mounting substrate accommodating there in an electronic component for use in a surface mount crystal oscillator and adapted to be joined to a bottom surface of a crystal unit, comprising the steps of defining a recess with a bottom wall and a frame wall having an opening, placing the electronic component in the recess, filling the recess with a resin for protecting the electronic component, and, after the resin is cured, removing at least a portion of the frame wall.

The method according to the present invention is suitable for producing a plurality of mounting substrates at one time. For example, the method may comprise the steps of laminating a bottom wall sheet and a frame wall sheet having a plurality of openings defined therein, thereby producing a sheet substrate, placing electronic components in recesses which are provided by the openings, respectively, filling the recesses with a resin for protecting the electronic components, and, after the resin is cured, severing the sheet substrate at least in positions where the resin is provided, into mounting substrates each with at least a portion of a frame wall which surrounds the recess being removed. Alternatively, the method may comprise the steps of laminating a bottom wall sheet and a frame wall sheet having a plurality of elongate openings defined therein, thereby producing a sheet substrate, placing electronic components in grooves which are provided by the openings, filling the grooves with a resin for protecting the electronic components, and, after the resin is cured, severing the sheet substrate including the resin in positions between adjacent ones of the electronic components, into mounting substrates.

According to the present invention, the electronic component typically comprises an IC chip incorporating an integrated oscillating circuit that employs a crystal unit. The IC chip may also incorporate therein a temperature compensating mechanism and a PLL control circuit as integrated circuits.

The second object can be achieved by a surface mount crystal oscillator comprising a crystal unit and a mounting substrate manufactured by the above method and joined to a bottom surface of the crystal unit.

With the arrangement of the present invention, an electronic component is placed in a recess defined by a bottom wall and a frame wall, the recess is then filled up with a resin for protecting the electronic component, and thereafter at least a portion of the frame wall is removed. Even if the electronic component is of a large size, it can be mounted on the mounting substrate. As a result, efforts to increase the size of the surface mount crystal oscillator are promoted. The productivity of the mounting substrate and the surface mount crystal oscillator is increased as the resin is prevented from flowing out of the recess when it is in a liquid state.

DETAILED DESCRIPTION OF THE INVENTION

Figure 1A:
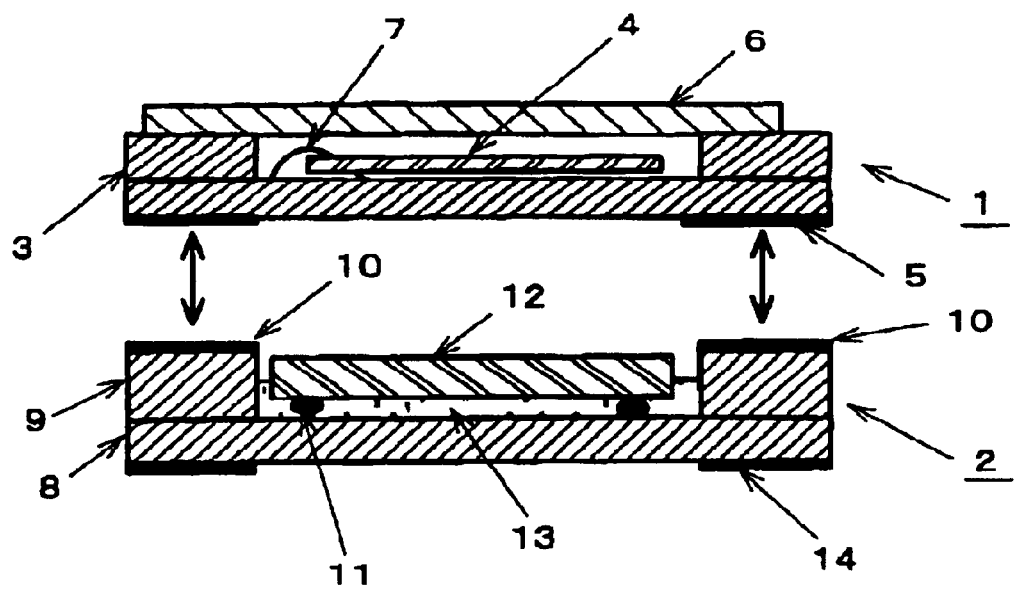
FIG. 1A is an exploded cross-sectional view of a conventional surface mount crystal oscillator.
Figure 1B:
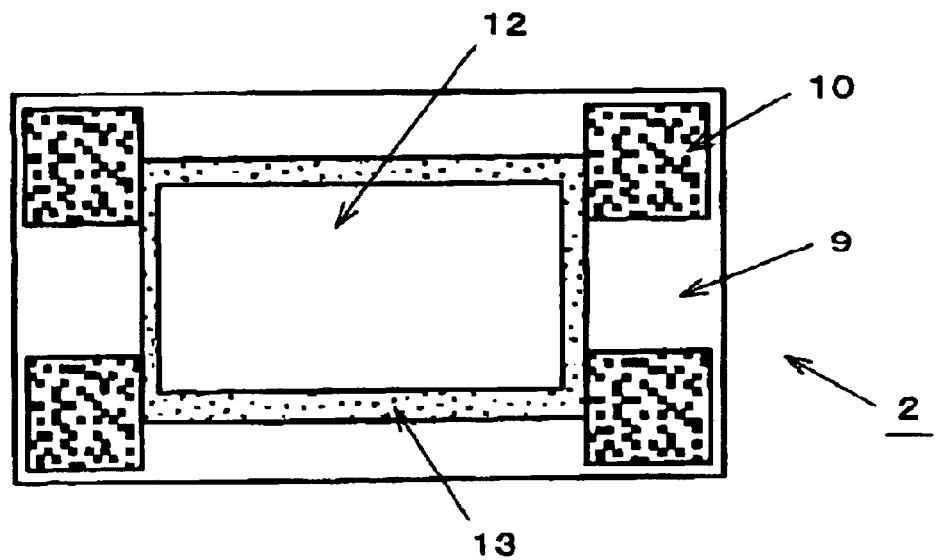
FIG. 1B is a plan view of a mounting substrate for used in the conventional surface mount crystal oscillator shown in FIG. 1A.
Figure 2:
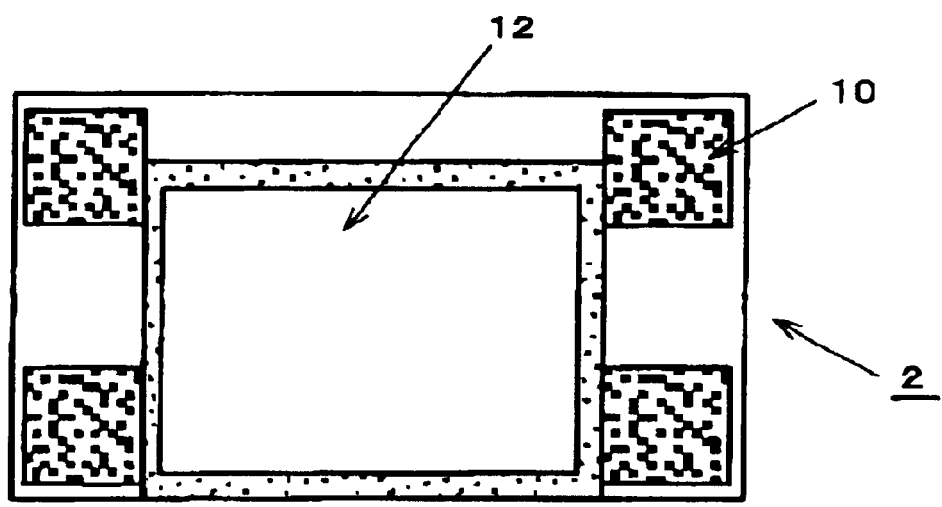
FIG. 2 is a plan view of another conventional mounting substrate.

A surface mount quartz crystal oscillator according to a first embodiment of the present invention comprises a quartz crystal unit and a mounting substrate joined to the reverse surface of the crystal unit, as with the conventional surface mount crystal oscillator shown in FIGS. 1A and 1B, the crystal unit being identical to the crystal unit shown in FIG. 1A. The mounting substrate of the surface mount crystal oscillator according to the first embodiment of the present invention and a method of manufacturing the mounting substrate will be described below. Those parts shown in FIGS. 3A, 3B, 4A, and 4B which are identical to those shown in FIGS. 1A and 1B are denoted by identical reference characters.

Figure 3A:
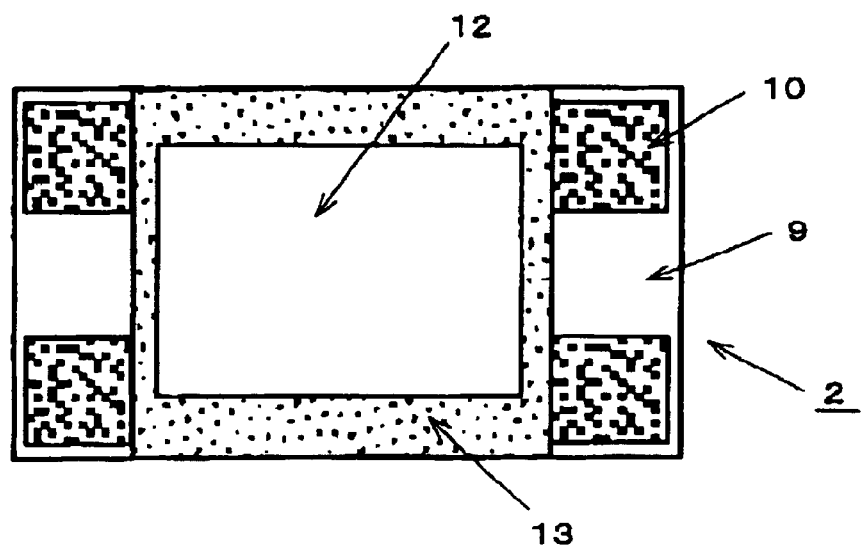
FIGS. 3A and 3B are plan and cross-sectional views, respectively, of a mounting substrate for used in a surface mount crystal oscillator according to a first embodiment of the present invention.
Figure 3B:
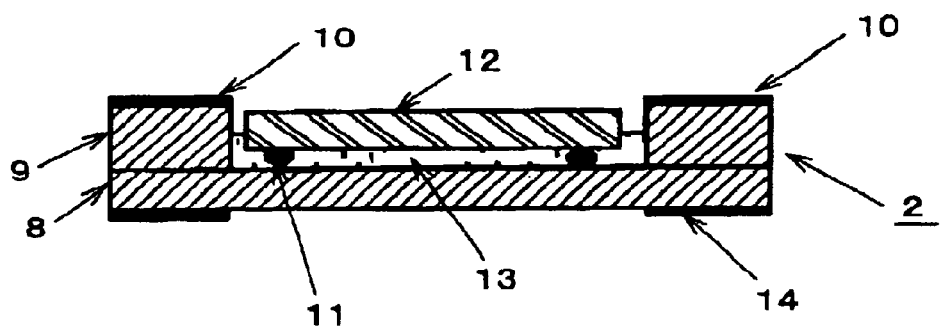

As shown in FIGS. 3A and 3B, mounting substrate 2, which is essentially the same as the mounting substrate shown in FIGS. 1A and 1B, has a substantially rectangular planar shape with a recess defined in a principal surface thereof. Frame wall 9 is disposed only along the shorter sides of mounting substrate 2, with the recess being open upwardly and downwardly as shown in FIG. 3A. As no frame wall 9 is disposed along the longer sides of mounting substrate 2, the recess has a large bottom area, and IC chip 12 is fixedly mounted in the large bottom by bumps 11. Resin 13 for protecting IC chip 12 is poured into the recess, filling up the recess. Resin 13 extends to the ends of mounting substrate 2 on the longer sides of mounting substrate 2.

A process of manufacturing mounting substrate 2 will be described below.

Figure 4A:
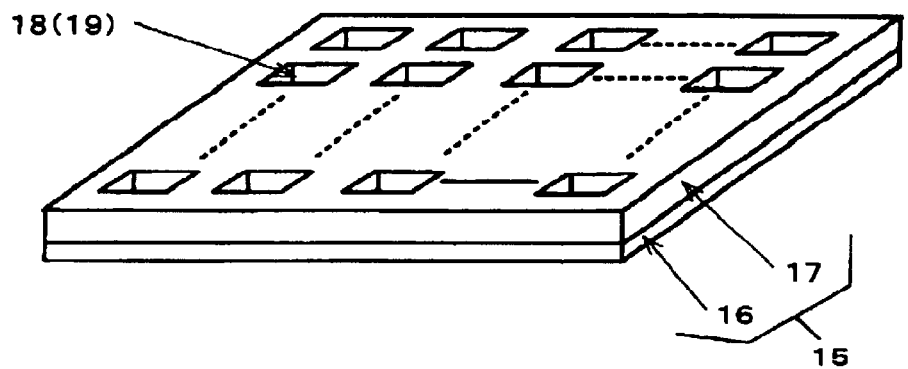
FIG. 4A is a perspective view of a sheet substrate for producing the mounting substrate shown in FIGS. 3A and 3B.
Figure 4B:
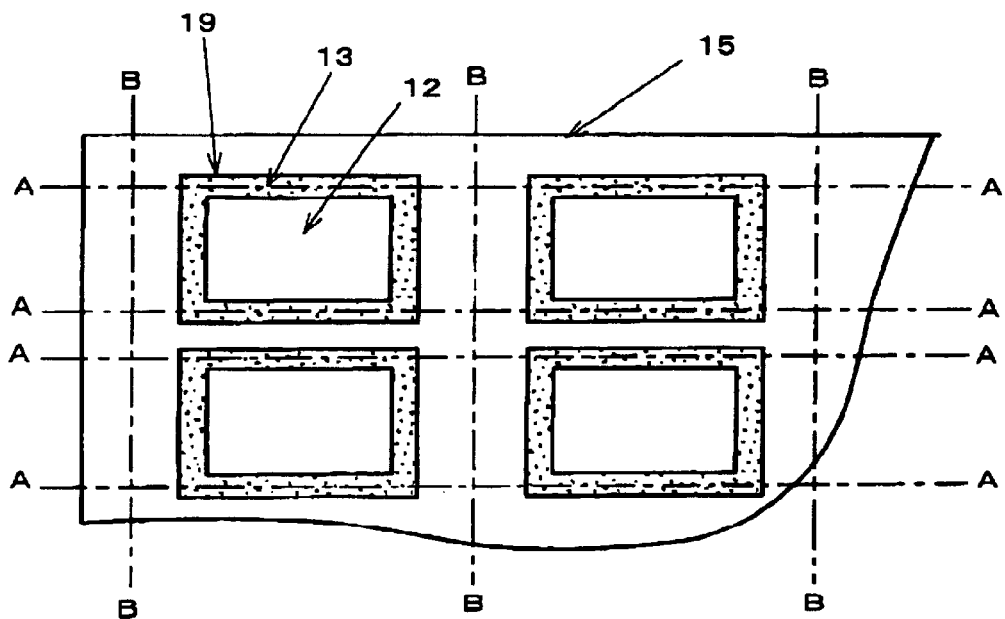
FIG. 4B is an enlarged fragmentary plan view of the sheet substrate shown in FIG. 4A.

As shown in FIG. 4A, mounting substrate 2 is fabricated by preparing sheet substrate 15 that has a size corresponding to a number of mounting substrates 2 and has a plurality of recesses 19 defined therein which correspond to respective mounting substrates, and dividing sheet substrate 15 into individual mounting substrates 2. In FIG. 4A, recesses 19 defined in sheet substrate 15 each have a substantially rectangular shape, and are arranged in a two-dimensional array of rows and columns. As shown in FIG. 4B, sheet substrate 15 are divided along separation lines A—A, B—B into individual mounting substrates 2.

Sheet substrate 15 comprises a laminated assembly of flat bottom wall sheet 16 and frame wall sheet 17 joined to an upper surface of flat bottom wall sheet 16. Frame wall sheet 17 has a two-dimensional array of openings 18 defined therein. Flat bottom wall sheet 16 and frame wall sheet 17 are baked from respective green sheets of ceramics into a unitary laminated structure as sheet substrate 15. Thus, sheet substrate 15 is made of laminated ceramics, and frame wall sheet 17 and bottom wall sheet 16 jointly define a plurality of recesses 19 at respective openings 18. Though not shown in FIGS. 4A and 4B, connecting terminals 10 and mounting terminals 14 are integrally baked with bottom wall sheet 16 and frame wall sheet 17, respectively. Bottom wall sheet 16 serves as bottom wall 8 of mounting substrate 2, and frame wall sheet 17 as frame wall 9 of mounting substrate 2.

Each of recesses 19 defined in sheet substrate 15 is of the same length as the length of the recess in mounting substrate 2 in the longitudinal direction of mounting substrate 2, but has a width greater than the width of the recess in mounting substrate 2 in the transverse direction of mounting substrate 2.

After sheet substrate 15 shown in FIG. 4A is produced by baking, IC chips 12 are fixed to the bottom wall of bottom wall sheet 16 in respective recesses 19 by ultrasonic thermocompression bonding with bumps 11. Thereafter, resin 13 for protecting IC chips 12 is poured into recesses 19, filling up recesses 19. After poured resin 13 is cured, sheet substrate 15 including resin 13 is severed along separation lines A—A on the longer sides of recesses 19 in sheet substrate 15 between the edges of recesses 19 and IC chips 12, as shown in FIG. 4B. Then, sheet substrate 15 is severed from above frame wall sheet 17 along separation lines B—B intermediate between recesses 19 that are adjacent to each other horizontally in FIG. 4B.

In this manner, sheet substrate 15 is divided into individual mounting substrates 2, each constructed as shown in FIG. 3A, free of frame walls along the longer sides and filled with resin 13. Then, as described above, each of mounting substrates 2 is joined to the bottom surface of crystal unit 1, thus completing a surface mount crystal oscillator.

According to the above process of manufacturing a mounting substrate, the recess in mounting substrate 2 has an increased bottom area as no frame wall 9 extends along the longer sides of mounting substrate 2. Therefore, large-size IC chip 12 can be placed on the bottom wall in the recess of mounting substrate 2. Since resin 13 is poured into the recess to fill up the recess before sheet substrate 15 is cut off into individual mounting substrates 2, resin 13 would not flow out from the open ends of the recess. Thus, any poured resin is prevented from being deposited on the outer surface of mounting substrate 2, which can satisfy predetermined requirements for increased productivity. According to the present embodiment, because mounting substrate 2 thus manufactured is bonded to the bottom surface of crystal unit 1, efforts to reduce the size of the surface mount crystal oscillator are promoted.

A surface mount crystal oscillator according to a second embodiment of the present invention will be described below.

Figure 5A:
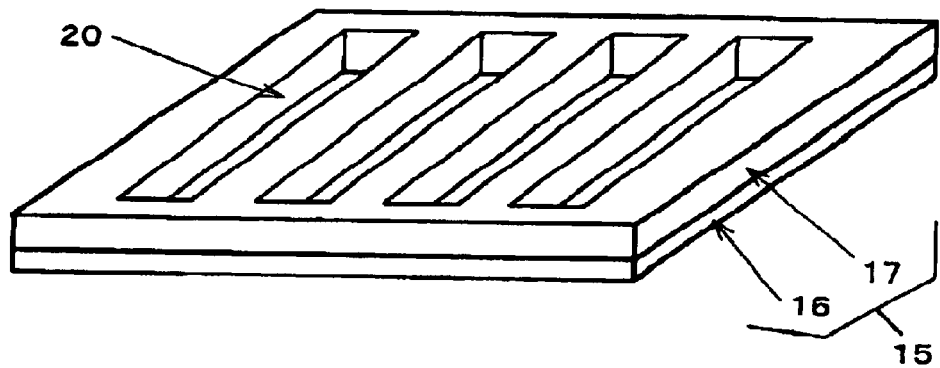
FIG. 5A is a perspective view of a sheet substrate for producing a mounting substrate according to a second embodiment of the present invention.
Figure 5B:
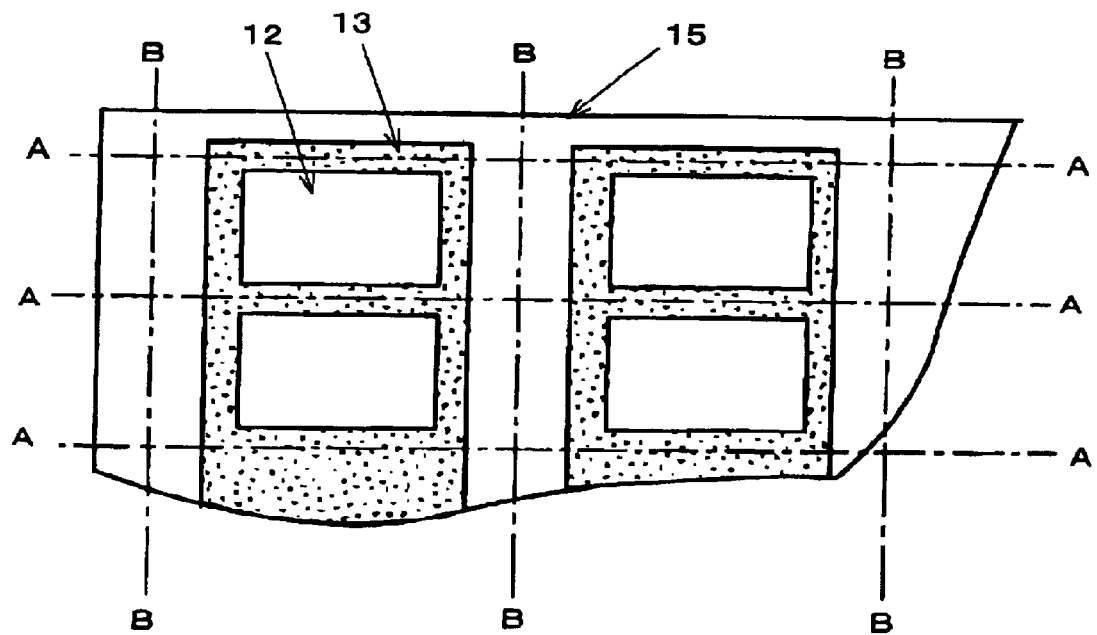
FIG. 5B is an enlarged fragmentary plan view of the sheet substrate shown in FIG. 5A.

In the first embodiment described above, sheet substrate 15 has independent recesses 19 for respective mounting substrates 2. However, the present invention is not limited to such a configuration, but a sheet substrate may have a plurality of grooves each providing the recesses of a plurality of adjacent mounting substrates, and may be divided into a plurality of mounting substrates. FIGS. 5A and 5B shows such a modified sheet substrate according to a second embodiment of the present invention.

As shown in FIG. 5A, sheet substrate 15 from which a plurality of mounting substrates 2 are produced comprises a laminated baked assembly of flat bottom wall sheet 16 and frame wall sheet 17 joined to an upper surface of flat bottom wall sheet 16. Frame wall sheet 17 has a plurality of elongate openings each extending in the direction in which a group of mounting substrates 2 to be produced from sheet substrate 15 are adjacent transversely thereof. Frame wall sheet 17 mounted on flat bottom wall sheet 16 provides a plurality of grooves 20, each closed at opposite ends thereof, defined in sheet substrate 15. Each of grooves 20 corresponds to the recesses in a plurality of mounting substrates 2 to be produced from sheet substrate 15 which are adjacent transversely thereof.

After sheet substrate 15 shown in FIG. 5A is produced, IC chips 12 are fixed to the bottom wall of bottom wall sheet 16 in respective grooves 20. IC chips 12 are fixed substantially centrally in the respective positions corresponding to respective mounting substrates 2. Then, resin 13 for protecting IC chips 12 is poured into grooves 20, filling up grooves 20.

After poured resin 13 is cured, sheet substrate 15 including resin 13 is severed along separation lines A—A transversely across grooves 20 at positions between adjacent IC chips 12 that are positioned within same grooves 20, as shown in FIG. 5B. Then, sheet substrate 15 is severed from above frame wall sheet 17 along separation lines B—B intermediate between grooves 20 that are adjacent to each other horizontally in FIG. 5B.

By thus cutting off sheet substrate 15, same mounting substrate 2 as with the first embodiment is produced. Then, each of mounting substrates 2 is joined to the bottom surface of crystal unit 1, thus completing the surface mount crystal oscillator.

According to the second embodiment, the recess in mounting substrate 2 has an increased bottom area as no frame wall 9 extends along the longer sides of mounting substrate 2. Therefore, large-size IC chip 12 can be placed on mounting substrate 2. Resin 13 is prevented from flowing out from the recess, the productivity of mounting substrate 2 is high, and efforts to reduce the size of the surface mount crystal oscillator are promoted.

In each of the above embodiments, frame wall 9 surrounding the recess in mounting substrate 2 which is of a substantially rectangular planar shape is removed from two confronting longer sides of mounting substrate 2. However, the positions from which frame wall 9 is removed are not limited to those two confronting longer sides of mounting substrate 2. Rather, frame wall 9 may be removed from only one longer side of mounting substrate 2 or may be removed from one or both of the shorter sides of mounting substrate 2.

In each of the above embodiments, a high-functionality IC chip having an oscillating circuit, a PLL control circuit and the like is disposed in the recess in mounting substrate 2. However, any of various other electronic components may be disposed in the recess in mounting substrate 2. For example, an IC chip having an ordinary oscillating circuit may be disposed in the recess in mounting substrate 2. If necessary, an electronic component including capacitors or other chip devices may be mounted on the mounting substrate.

According to the present invention, the process of fixing an IC chip is not limited to ultrasonic thermo-compression bonding with bumps, but may be wire bonding.

In the above embodiments, the mounting substrate is joined to the bottom surface of the crystal unit such that the open side of the mounting substrate faces the crystal unit. However, the mounting substrate may be joined to the bottom surface of the crystal unit such that the closed side of the mounting substrate faces the crystal unit. In such a modification, connecting terminals 10 are disposed on the closed side of mounting substrate 2, and the mounting terminals 14 are disposed on the open side of mounting substrate 2. If a high-functionality IC chip is mounted on the mounting substrate, then since an increased number of mounting terminals need to be connected to the IC chip, the mounting terminals may be of a BGA (Ball Grid Array) structure having solder balls or the like.

What is claimed is:

1. A method of manufacturing a mounting substrate accommodating therein an electronic component for use in a surface mount crystal oscillator and adapted to be joined to a bottom surface of a crystal unit, comprising the steps of:
    defining a recess with a bottom wall and a frame wall having an opening;
    placing the electronic component in said recess;
    filling said recess with a resin for protecting said electronic component; and
    after said resin is cured, removing at least a portion of said frame wall.

2. The method according to claim 1, wherein said mounting substrate has a substantially rectangular planar shape, and said frame wall is removed along a pair of longer sides of said mounting substrate.

3. The method according to claim 1, wherein said electronic component comprises an IC chip.

4. A method of manufacturing a mounting substrate accommodating therein an electronic component for use in a surface mount crystal oscillator and adapted to be joined to a bottom surface of a crystal unit, comprising the steps of:
    laminating a bottom wall sheet and a frame wall sheet having a plurality of openings defined therein, thereby producing a sheet substrate;
    placing electronic components in recesses which are provided by said openings, respectively;
    filling said recesses with a resin for protecting said electronic components; and
    after said resin is cured, severing said sheet substrate at least in positions where said resin is provided, into mounting substrates each with at least a portion of a frame wall which surrounds said recess being removed.

5. The method according to claim 4, wherein said sheet substrate is formed by baking.

6. The method according to claim 4, wherein each of said mounting substrates has a substantially rectangular planar shape, and said sheet substrate is severed to remove said frame wall along a pair of longer sides of said mounting substrate.

7. The method according to claim 4, wherein said electronic components comprise IC chips.

8. A method of manufacturing a mounting substrate accommodating therein an electronic component for use in a surface mount crystal oscillator and adapted to be joined to a bottom surface of a crystal unit, comprising the steps of:
    laminating a bottom wall sheet and a frame wall sheet having a plurality of elongate openings defined therein, thereby producing a sheet substrate;
    placing electronic components in grooves which are provided by said openings;
    filling said grooves with a resin for protecting said electronic components; and
    after said resin is cured, severing said sheet substrate including said resin in positions between adjacent ones of said electronic components, into mounting substrates.

9. The method according to claim 8, wherein said sheet substrate is formed by baking.

10. The method according to claim 8, wherein said electronic components comprise IC chips.

11. A surface mount crystal oscillator comprising:
    a crystal unit; and
    a mounting substrate manufactured by a method according to claim 1 and joined to a bottom surface of said crystal unit.

12. A surface mount crystal oscillator comprising:
    a crystal unit; and
    a mounting substrate manufactured by a method according to claim 4 and joined to a bottom surface of said crystal unit.

13. A surface mount crystal oscillator comprising:
    a crystal unit; and
    a mounting substrate manufactured by a method according to claim 8 and joined to a bottom surface of said crystal unit.

* * * * *